United States Patent
Schroeder et al.

(10) Patent No.: US 6,529,035 B2
(45) Date of Patent: Mar. 4, 2003

(54) ARRANGEMENT FOR IMPROVING THE ESD PROTECTION IN A CMOS BUFFER

(75) Inventors: Hans-Ulrich Schroeder, Quickborn (DE); Joachim Christian Reiner, Thalwil (CH)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/930,652

(22) Filed: Aug. 15, 2001

(65) Prior Publication Data

US 2002/0075034 A1 Jun. 20, 2002

(30) Foreign Application Priority Data

Aug. 21, 2000 (DE) .......................... 100 41 139

(51) Int. Cl.$^7$ .......................... H03K 19/0175
(52) U.S. Cl. .......................... 326/26; 326/83; 326/50; 326/101; 326/102; 257/355; 257/358; 257/360; 257/368
(58) Field of Search .......................... 326/26, 83, 50, 326/101, 102; 257/355, 358, 360, 368

(56) References Cited

U.S. PATENT DOCUMENTS

| 4,808,861 | A | | 2/1989 | Ehni .......................... 307/579 |
|---|---|---|---|---|
| 5,060,037 | A | | 10/1991 | Rountree .................. 357/23.13 |
| 5,780,897 | A | | 7/1998 | Krakauer ..................... 257/368 |
| 5,831,316 | A | * | 11/1998 | Yu et al. ........................ 11/998 |
| 5,898,206 | A | | 4/1999 | Yamamoto ................... 257/360 |
| 6,140,682 | A | * | 10/2000 | Liu et al. ..................... 257/355 |
| 6,323,689 | B1 | * | 11/2001 | Morishita ................... 326/101 |

* cited by examiner

Primary Examiner—Michael Tokar
Assistant Examiner—Vibol Tan
(74) Attorney, Agent, or Firm—Steven R. Biren

(57) ABSTRACT

An arrangement for improving the ESD protection in a CMOS buffer includes a plurality of PMOS transistors (31 to 37) and a plurality of NMOS transistors (41–47) which are connected in series with the PMOS transistors and have a finger width $W_N$ which is larger than the finger width $W_P$ of the PMOS transistors in order to be capable of withstanding an increased current load in the case of an electrostatic discharge.

13 Claims, 4 Drawing Sheets

ARRANGEMENT FOR IMPROVING THE ESD PROTECTION IN A CMOS BUFFER

BACKGROUND OF THE INVENTION

The invention relates to an arrangement for improving the ESD protection in a CMOS buffer which includes a plurality of parallel-connected PMOS transistors and a plurality of parallel-connected NMOS transistors which are connected in series with the PMOS transistors.

Electrostatic discharges (ESD) are among to the most destructive, unavoidable environmental influences whereto electronic systems and integrated circuits are exposed. For example, in the case of an ESD event integrated circuits must conduct currents in the ampere range during nanoseconds. The destructive effect of such current densities on the circuit on the one hand is due to the very high thermal loss power in relation to the dimensions of the circuit element whereas on the other hand overvoltages which are capable of destroying thin oxide are generated on the chip. From a point of view of the further development of circuits in contemporary VLSI processes, the control of such parasitic effects becomes the central problem, because the miniaturization increases the susceptibility to ESD events.

Electrostatic charges are caused by friction between materials, for example by walking on carpets. Cumulation and storage of the charge may give rise to electrostatic potentials amounting to several kV. Such stored charges are transferred when highly integrated semiconductor components are contacted; this is also referred to as electrostatic discharging (ESD). From an electrical point of view electrostatic discharges constitute large transient large current events with a peak current of several amperes and a duration of from 10 ns to 300 ns. Such transient currents endanger integrated circuits in various ways:

- the electric overloads are capable of thermally destroying the integrated circuit on the one hand,
- on the other hand, an excess voltage may cause gate oxide punctures at the MOS gates,
- moreover, recurrent exposure to ESDs may cause degradation phenomena which lead to an increase of the leakage currents.

Irrespective of the type of ESD load, the semiconductor component incurs either irrepairable damage or its operation becomes inadequate or at least degraded.

As the integration density of CMOS processes becomes higher, the risk of rejection of integrated circuits due to faults that can be attributed to destruction by electrostatic discharges increases.

Voltage limitation is performed by means of known ESD protection circuits. The actual circuit to be protected must have an appropriate overvoltage strength for this purpose.

U.S. Pat. No. 6,034,552 describes an ESD protection circuit which utilizes a dynamic floating gate arrangement. This arrangement improves the ESD robustness of the current driving programmable CMOS output buffer. Such an ESD protection circuit requires an additional surface area on the silicon and is difficult to integrate in the process for internal buffers.

SUMMARY OF THE INVENTION

Therefore, it is an object of the invention to propose an arrangement which increases the overvoltage strength of circuits.

This object is achieved in that the individual transistors are formed by finger surfaces and that the finger width $W_N$ of the gates of the NMOS transistors is such that they can carry a current in the case of an ESD event without the transistor finger being destroyed.

The faults that can be caused by ESD exposure of CMOS circuit arrangements are due mainly to the snap-back phenomenon of the NMOS transistors. In particular large buffers suffer from this phenomenon, for example buffers as used for clock generators or in principle buffers which are intended to deliver a very high output drive power. The buffer sensitivity in respect of ESD robustness constitutes a problem which is very much dependent on the layout.

Notably NMOS transistors exhibit a snap-back behavior of the drain source voltage $V_{DS}$ when the drain source voltage $V_{DS}$ reaches a trigger voltage which is higher than the drain substrate breakdown voltage $V_{BD}$.

This snap-back behavior of the drain source voltage $V_{DS}$ occurs due to the positive feedback mechanism between the avalanche breakdown of the drain substrate transition and the parasitic bipolar transistor that is formed by the drain, the bulk and the source. Once this avalanche feedback mechanism has locally started, it propagates along the drain edge by lateral diffusion of the relevant charge carriers until the entire transistor finger operates homogeneously in the snap-back mode. The differential resistance of the relevant NMOS transistor is very low in this snap-back mode. As a result, the current flow is not adequately limited by external resistances, which may give rise to destruction of the NMOS transistor. This significant snap-back phenomenon does not occur in PMOS transistors or to a very limited extent only, so that the PMOS transistors are more robust in respect of exposure to ESD.

During an ESD event the voltage carried by the circuit increases beyond the normal supply voltage $V_{DD}$. A typical ESD on chip protection circuit limits the voltage $V_{DD}-V_{SS}$ to a level $V_{DDclamp}$. The voltage $V_{DDclamp}$ is then present throughout the active circuit in the case of an ESD event. Depending on the voltage level on the gate of the buffer, a current from $V_{DD}$ to $V_{SS}$ flows through the buffer flows, that is, through the PMOS and NMOS transistors. Three different cases can then be distinguished.

1. The PMOS transistor is not conductive and the NMOS transistor is conductive. The voltage $V_{DDclamp}$ is then present across the PMOS transistor. The PMOS transistor is usually robust enough so as to avoid destruction.
2. Both transistors, that is, the PMOS as well as the NMOS transistor, are conductive. A current then flows which is limited by the resistance of the two series-connected transistors. When the size of the PMOS and NMOS transistors does not deviate too much, which is normally the case, the current density that can occur remains far enough below a fault threshold voltage for most technologies.
3. The PMOS transistor is conductive and the NMOS transistor is not conductive. In this case the voltage $V_{DDclamp}$ is present across the NMOS transistor, that is, via the conductive PMOS transistor. When the $V_{DS}$ voltage of the NMOS transistor reaches the snap-back trigger voltage $V_{Trigg}$, the latter transistor enters the snap-back mode. Because of the low differential resistance of the NMOS transistor in the snap-back mode, the current is limited mainly by the resistance of the PMOS transistor. For typical inverters the resultant current density is lower than a reasonable fault level.

The transistors in large buffers are customarily constructed as multi-finger devices. A buffer constitutes, for example, an inverter stage for impedance conversion wherein a given signal is to be driven with a large output power. This is a kind of amplifier stage or drive stage. Therefore, use is also made of large transistors with many fingers which may give rise to the described problems. The drive power of the buffer can be increased by increasing the number of fingers.

Internal buffers are to be understood to mean buffers that drive internal nodes of a CMOS circuit but no input or output pads situated outside the circuit. In the case of an internal buffer, an ESD cannot penetrate the buffer via an input pad or an output pad. This is opposed to an output buffer which drives input pads or output pads. The ESD can directly affect the output buffer via such input pads or output pads.

When the voltage $V_{Trigg}$ of the NMOS transistors is reached in such a multi-finger circuit, it may occur that the finger that is switched at the relevant instant is the first one to pull down the drain source voltage of the other NMOS transistors which are connected in parallel. Consequently, the other fingers can no longer be switched and the switched NMOS transistor will draw the total current that normally flows via all fingers. In that case the current density very soon exceeds a threshold value for an individually switched NMOS finger, leading to destruction of this finger and ultimately of the switching circuit. The destroyed finger then remains open; this becomes manifest as an increased operating current and standby current. For the described reasons the occurrence of faults in such buffers is dependent on the input voltage during an ESD exposure.

The NMOS transistor fingers are damaged because of the excessively high current density during an ESD event. The fault current level typically amounts to a few milliamperes per μm of transistor finger width; it is highly dependent on the type of CMOS manufacturing technology used and is also influenced by the channel length. The critical layout parameter can be described by way of the ratio of the overall PMOS transistor width to the single NMOS transistor finger width. This ratio is also referred to as the finger width ratio $R_W$ in many cases.

$$R_W = W_P^{single} \times N_P / W_N^{single}$$

where $W_P^{single}$ is the single finger width of a PMOS transistor, $W_N^{single}$ is the single finger width of an NMOS transistor, and $N_P$ is the number of PMOS transistors.

The finger width ratio $R_W$ is high in the case of a traditional layout. Buffers are traditionally constructed while using corresponding PMOS transistors and NMOS transistor finger widths in such a manner that the buffer fits in a given power supply rail grid. The drive power of the buffer that can be realized in this sense, without exceeding a critical finger width ratio $R_{WC}$, is limited. Larger and stronger buffers with a ratio $R_W < R_{WC}$ can be realized by increasing the finger width of the transistor. Such buffers, however, would not fit in the power supply grid, thus giving rise to problems during the manufacture of the switching circuit. A further possibility of making such a buffer more robust against ESD events would be the connection of a resistor in series with every NMOS transistor finger. However, this takes up additional surface area on the silicon and at the same time reduces the output drive power of the buffer.

Therefore, in accordance with the invention it is proposed to make the width of the NMOS fingers such that an increased current density in the event of ESD does not lead to destruction of the transistor finger. To this end, the width of the NMOS finger can be advantageously increased in such a manner that the switched NMOS transistor finger is not destroyed in the case of an ESD exposure because, due to its large width, the overall current supplied by the PMOS transistor fingers does not lead to a critical current density in the switched NMOS finger. For a ratio $R_W$ where the sum of the finger widths of the PMOS transistors to the finger width of each individual NMOS transistor is less than 5 it may be assumed that the current density in the switched NMOS transistor finger will not lead to destruction of the transistor in the case of ESD.

In a further embodiment of the invention the transistor fingers of the NMOS transistors are constructed in such a manner that a current density of 5 mA/μm is not exceeded in the case of ESD. An increased current density can be avoided by increasing the width of the transistor fingers.

In a preferred embodiment of the invention the gates of the NMOS transistors have a finger width $W_N$ which amounts to at least ten times the length $L_N$ of the gates of the transistor fingers of the NMOS transistors. This length-to-width ratio is characteristic notably of CMOS buffers that must have a high output power.

A special embodiment of the invention is realized in that a smaller number of parallel-connected NMOS transistors is connected in series with the PMOS transistors. Such parallel-connected NMOS transistors have a finger width at the gates which is larger than the finger width of the gates of the PMOS transistors, with the result that the current density occurring in the NMOS finger in the case of ESD is reduced.

The PMOS transistors and the NMOS transistors in a further embodiment of the invention are connected by means of a multi-gate. Preferably, groups of PMOS and/or NMOS transistors can also be connected to one another by means of a multi-gate. It is also feasible for each individual transistor to receive an independent signal at its gate.

PMOS transistors in a further embodiment in accordance with the invention are combined in a logic circuit, a number of at the most as many NMOS transistors with a larger width of the gate finger being connected in series therewith. The parallel connection of the NMOS transistors may also include series connections of a plurality of NMOS transistors.

The object is also achieved by means of an amplifier circuit in which a CMOS buffer in accordance with the invention acts as an output stage.

BRIEF DESCRIPTION OF THE DRAWING

An embodiment in accordance with the invention will be described in detail hereinafter with reference to the drawings. Therein.

DESCRIPTION OF THE PREFERRED EMBODIMENTS

Figure 1:
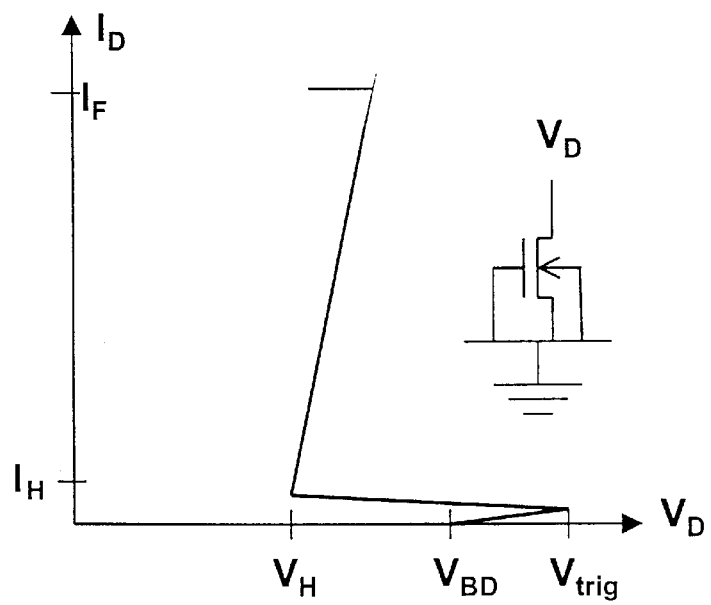
FIG. 1 illustrates the principle of the snap-back mode.

FIG. 1 shows the variation of the drain source current of an NMOS transistor having a grounded gate over the drain voltage $V_D$. When the drain voltage exceeds the voltage $V_{BD}$, a reverse breakdown current flows from the drain source transition. At the instant at which the drain voltage $V_D$ reaches the switching voltage $V_{Trigg}$, the drain voltage snaps back to the value $V_H$. When the drain current ID becomes larger than the current $I_H$, the drain current increases again but the increase of the drain voltage remains small. When the drain current reaches the value $I_F$, the damaging of the transistor commences.

Figure 2:
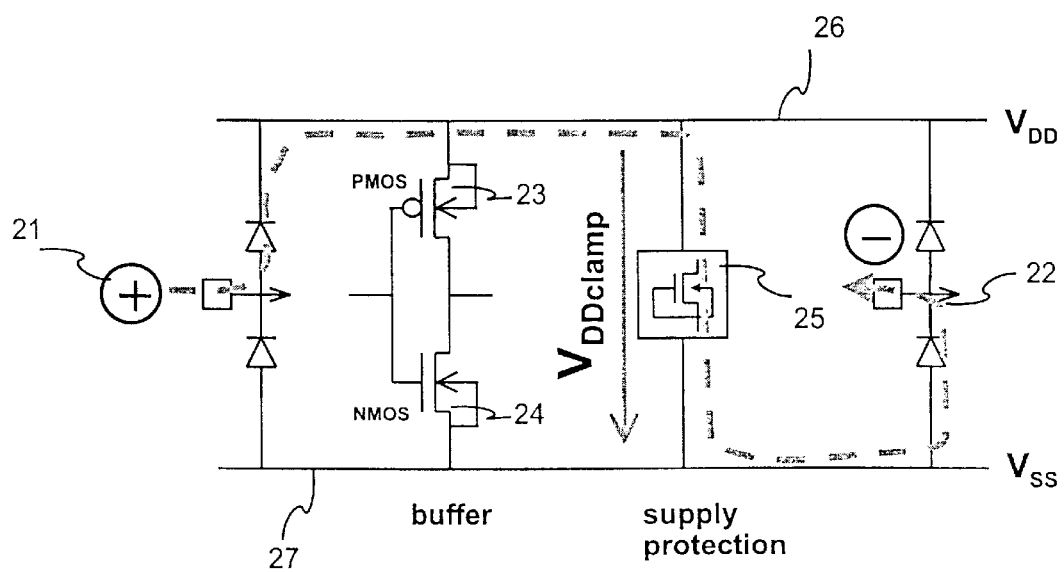
FIG. 2 shows an ESD protection network with an ESD load between the inputs and outputs.

FIG. 2 shows a circuit diagram of an ESD protection network with an internal buffer which includes the following components: an input 21, an output 22, a PMOS transistor 23, and an NMOS transistor 24. The ESD protection circuit 25 is connected between $V_{DD}$ 26 and $V_{SS}$ 27. In the ESD case shown, a current flows via $V_{DD}$ through the protective network 25 to the output 22. The voltage $V_{DDclamp}$ is then present between $V_{DD}$ 26 and $V_{SS}$ 27. Depending on whether the transistors 23 and 24 are conductive or not conductive, a current also flows via these transistors and causes a destruction, or not, in conformity with the previously described states.

Figure 3:
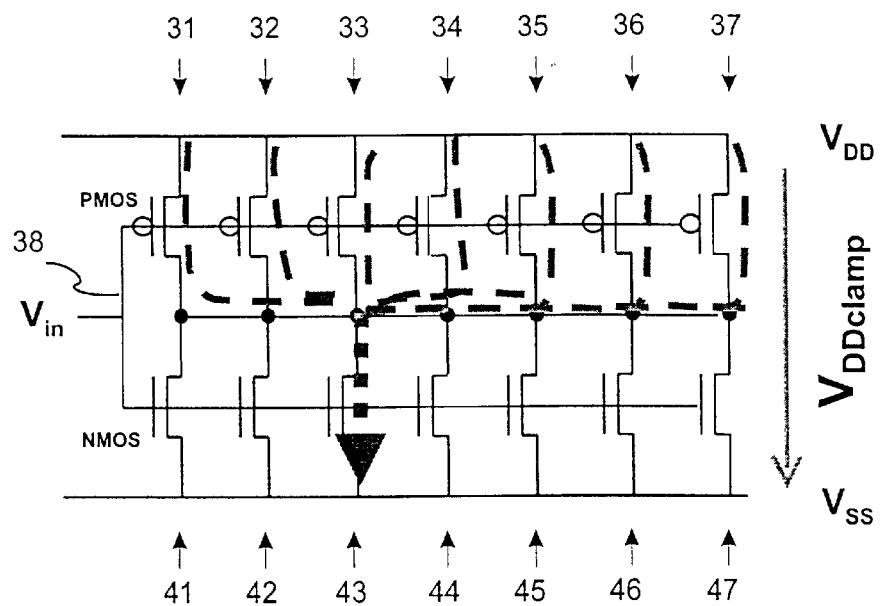
FIG. 3 shows a buffer according to the state of the art.

FIG. 3 shows a buffer in conformity with the present state of the art. It includes a plurality of PMOS transistors 31 to 37 which are connected parallel to one another. The NMOS transistors 41 to 47 are also connected parallel to one another. These transistors are connected to one another via a multi-gate 38. The multi-gate 38 constitutes the input of the circuit. In the case of ESD a current would flow via all PMOS transistors, however, only via the NMOS transistor that is actually being switched at that instant and operates in the snap-back mode, that is, the transistor 43. Because the current is distributed between all PMOS transistors, but is discharged only via a single NMOS transistor, this NMOS transistor is liable to be destroyed. transistors, but is discharged only via a single NMOS transistor, this NMOS transistor is liable to be destroyed.

Figure 4:
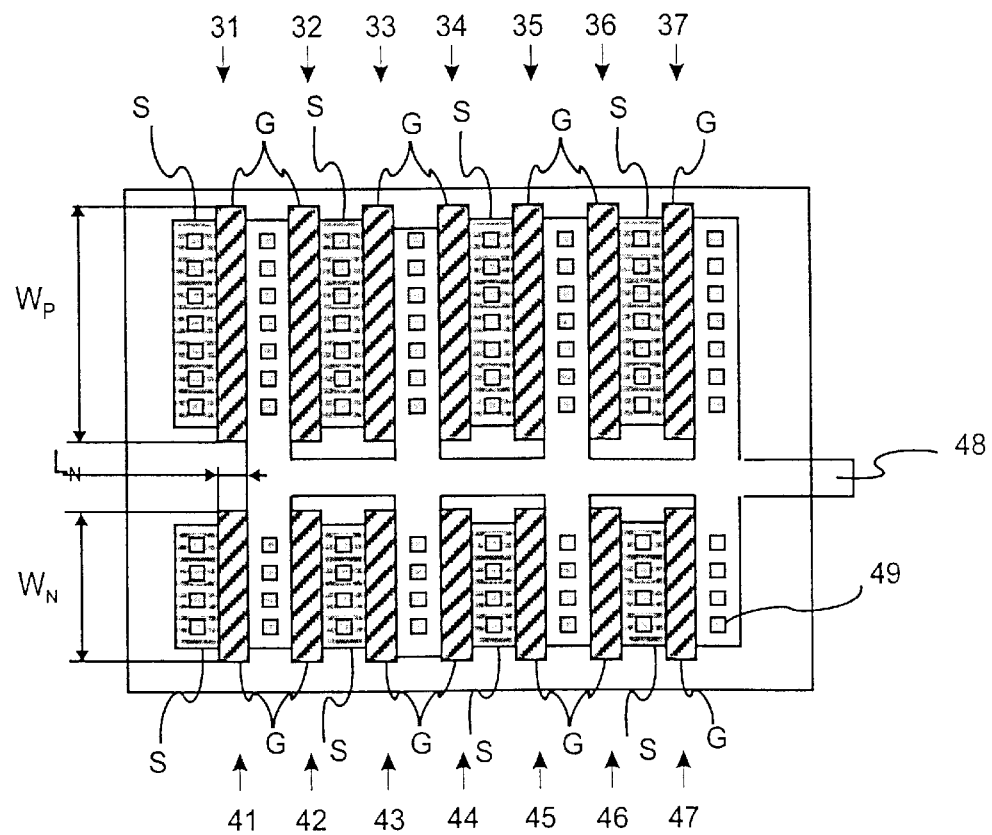
FIG. 4 shows a layout for buffers.

FIG. 4 shows the layout of a buffer in conformity with the state of the art and the principle described with reference to FIG. 3. The reference S denotes each time the source of the transistors. The PMOS transistors 31 to 37 are shown at the top of the Figure. The NMOS transistors 41 to 47 are shown at the bottom of the Figure. The transistors are connected to one another via a common drain 48. In this layout the gates of the PMOS and NMOS transistors are realized as independent gate fingers and not as a multi-gate as shown in FIG. 3. The current in the transistors flows from the drain to the source, via the gate, so that in this rendition the gate length L is clearly smaller than the finger width W of the gate. In this rendition, moreover, the finger width $W_N$ of the NMOS transistor finger gate is smaller than the finger width $W_P$ of the PMOS transistor finger gate. The reference numeral 49 denotes the contacts.

Figure 5:
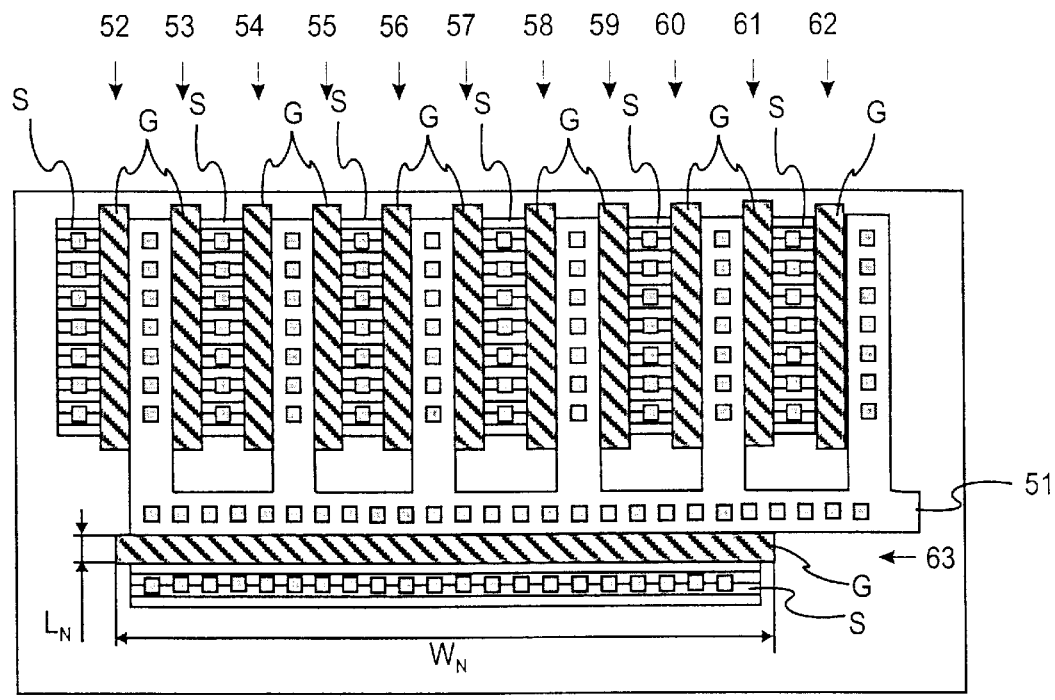
FIG. 5 shows a layout for a buffer, in accordance with the invention, FIGS. 6a,b show a circuit with a plurality of PMOS and NMOS transistors connected in series.

FIG. 5 shows a layout in accordance with the invention. The PMOS transistors 52 to 62 are connected parallel to one another and are interconnected via a common drain 51. Only one NMOS transistor 63 is connected in series with the PMOS transistors 52 to 62. The width of the gate fingers $W_N$ of this NMOS transistor 63 is substantially larger than that of the PMOS transistors 52 to 62. Because of this larger finger width $W_N$, such an arrangement of the NMOS transistor 63 is protected against damaging by an increased current flow in the case of an ESD load, so that it can readily dissipate the current distributed between a plurality of PMOS transistors.

Figures 6A, 6B:
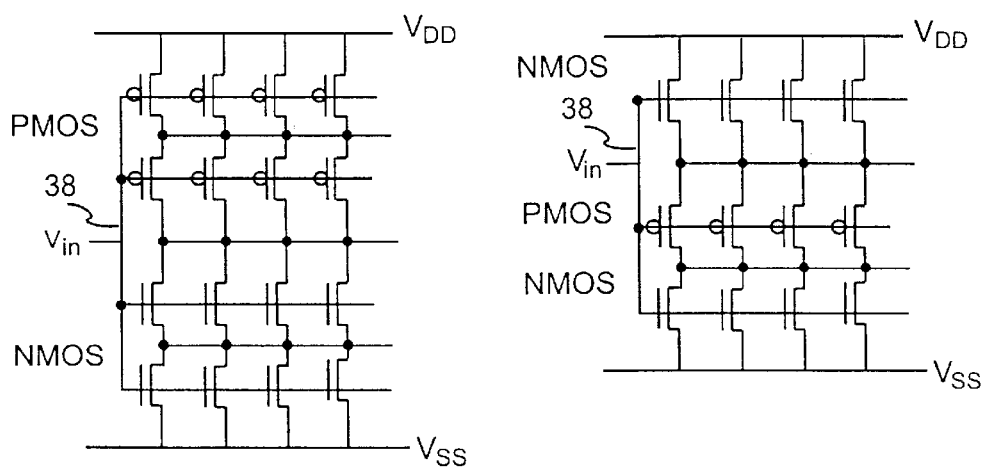

The FIGS. 6a and 6b show an internal CMOS buffer in which combinations of parallel connections and series connections of NMOS and PMOS transistors are used. The transistors are interconnected each time via a multi-gate 38. In a series connection of NMOS transistors the series-connected NMOS transistors have transistor fingers of a width which is larger than the width of the transistor fingers of the PMOS transistors so that they can dissipate the current in the case of ESD.

Figure 7:
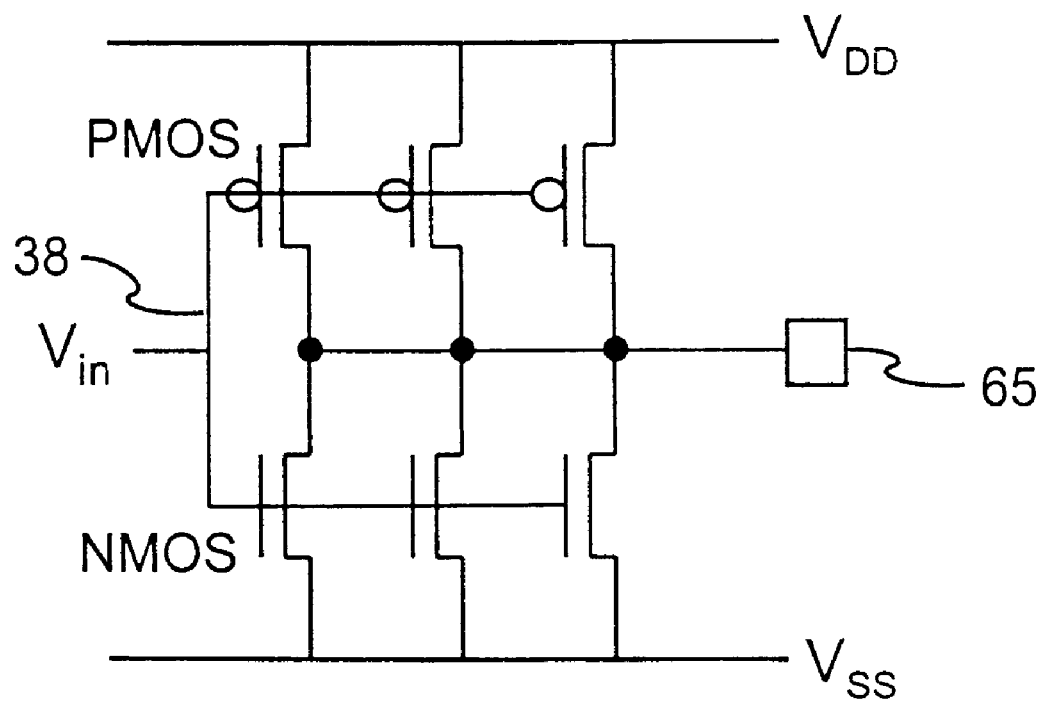
FIG. 7 shows a circuit for an output driver.

FIG. 7 shows a buffer in the form of an output driver stage. The buffer drives an output pad 65. The output pad 65 is situated externally, so that in the case of ESD the ESD discharge current can penetrate the buffer via the output pad 65. In order to dissipate the increased discharge current, the NMOS transistor finger is designed so as to have a very large width. The following formule should be used for the finger width of the NMOS transistor.

$$W_N^{single} * J_{krit} > I_{ESD}$$

Therein:

$W_N^{single}$ is finger width of an NMOS transistor $J_{KRIT}$ is the critical current density (in mA/$\mu$m), and $I_{ESD}$ is the current in the case of ESD.

What is claimed is:

1. An arrangement for improving the ESD protection in a CMOS buffer which includes a plurality of PMOS transistors (31 to 37) and a plurality of NMOS transistors (41 to 47) which are connected in series with the PMOS transistors, wherein the gates (G) of the individual transistors are realized in the form of finger surfaces and the finger width WN of the gates of the NMOS transistors (41 to 47) is proportioned so as to conduct a current without giving rise to destruction of the transistor finger in the case of ESD.

2. The arrangement as claimed in claim 1, characterized in that the ratio of the sum of the finger widths of the PMOS transistors to the finger width of each single NMOS transistor is larger than 5.

3. The arrangement as claimed in claim 1, characterized in that the transistor fingers of the NMOS transistors are formed in such a manner that a current density of 5 mA/$\mu$m is not exceeded in the case of ESD.

4. The arrangement as claimed in claim 1, characterized in that the finger width WN of the gates of the NMOS transistors (41 to 47) is larger than the finger width WP of the gates of the PMOS transistors.

5. The arrangement as claimed in claim 1, characterized in that the gates of the NMOS transistors have a finger width WN which is at least 10 times larger than the length LN of the transistor fingers of the gates of the NMOS transistors.

6. The CMOS buffer as claimed in claim 1, characterized in that no more than an equal number of parallel-connected NMOS transistors (58) is connected in series with the PMOS transistors (52 to 62).

7. The CMOS buffer as claimed in claim 1, characterized in that the PMOS transistors are connected to the NMOS transistors via a multi-gate (38).

8. The CMOS buffer as claimed in claim 1, characterized in that groups of transistors are connected to one another by means of a multi-gate.

9. The CMOS buffer as claimed in claim 1, characterized in that the arrangement of the PMOS transistors includes series connections of a plurality of PMOS transistors.

10. The CMOS buffer as claimed in claim 1, characterized in that a parallel connection of the NMOS transistors includes series connections of a plurality of NMOS transistors.

11. The CMOS buffer as claimed in claim 1, characterized in that the buffer includes a combination of parallel connections and series connections of NMOS transistors and PMOS transistors.

12. The CMOS buffer as claimed in claim 1, characterized in that the buffer forms an output stage of a CMOS circuit and that the finger width of an NMOS transistor is large enough to dissipate an ESD discharge current occurring on the output pad (65).

13. The amplifier circuit which includes an output stage in the form of a CMOS buffer as claimed in claim 1.

* * * * *